(12) United States Patent
Wei et al.

(10) Patent No.: US 12,463,029 B2
(45) Date of Patent: Nov. 4, 2025

(54) CLEANING METHOD, SEMICONDUCTOR MANUFACTURING METHOD AND A SYSTEM THEREOF

(71) Applicant: TAIWAN SEMICONDUCTOR MANUFACTURING COMPANY LTD., Hsinchu (TW)

(72) Inventors: Shao-Chi Wei, Hsinchu (TW); Hao-Ming Chang, Pingtung (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 499 days.

(21) Appl. No.: 17/814,843

(22) Filed: Jul. 26, 2022

(65) Prior Publication Data
US 2022/0359187 A1 Nov. 10, 2022

Related U.S. Application Data

(62) Division of application No. 16/548,824, filed on Aug. 22, 2019, now Pat. No. 11,600,484.

(51) Int. Cl.
| | |
|---|---|
| *H01L 21/02* | (2006.01) |
| *B08B 7/00* | (2006.01) |
| *H01L 21/027* | (2006.01) |
| *H01L 21/67* | (2006.01) |

(52) U.S. Cl.
CPC ...... *H01L 21/02052* (2013.01); *B08B 7/0057* (2013.01); *H01L 21/0274* (2013.01); *H01L 21/67051* (2013.01)

(58) Field of Classification Search
CPC .......... H01L 21/02052; H01L 21/0274; H01L 21/67051; H01L 21/67253; H01L 21/67288; H01L 21/02082; B08B 7/0057; B08B 13/00; B08B 3/02; G03F 1/82
See application file for complete search history.

(56) References Cited

U.S. PATENT DOCUMENTS

| | | | | |
|---|---|---|---|---|
| 4,715,392 A | * | 12/1987 | Abe ........................... | G03F 1/82 134/113 |
| 5,244,527 A | * | 9/1993 | Aoyagi ............. | H01L 21/67253 156/345.16 |
| 5,375,291 A | * | 12/1994 | Tateyama .................. | B08B 1/52 15/302 |

(Continued)

FOREIGN PATENT DOCUMENTS

CN 103187340 A * 7/2013 ....... H01L 21/67109

*Primary Examiner* — Michael E Barr
*Assistant Examiner* — Thomas Bucci
(74) *Attorney, Agent, or Firm* — WPAT LAW; Anthony King

(57) ABSTRACT

A cleaning method applied in semiconductor manufacturing is provided. The method includes: receiving a substrate having a surface; identifying a location of a particle on the surface of the substrate; moving a cleaning apparatus toward the location of the particle; performing a cleaning operation, thereby removing the particle by spraying a cleaning liquid from the cleaning apparatus flowing against gravity and toward the surface of the substrate; detecting the surface of the substrate; and performing a second cleaning operation when a cleaning result of the detection is not acceptable. A semiconductor manufacturing method and a system for cleaning a substrate are also provided.

20 Claims, 17 Drawing Sheets

A10

(56) References Cited

U.S. PATENT DOCUMENTS

| | | | | |
|---|---|---|---|---|
| 5,634,230 | A * | 6/1997 | Maurer | G03F 1/82 15/312.1 |
| 5,938,860 | A * | 8/1999 | Williams | G03F 1/64 134/2 |
| 5,964,952 | A * | 10/1999 | Kunze-Concewitz | H01L 21/02046 134/103.3 |
| 6,439,962 | B1 * | 8/2002 | Ato | B08B 1/36 451/6 |
| 7,069,155 | B1 * | 6/2006 | Phan | G03F 1/84 430/5 |
| 9,607,833 | B2 * | 3/2017 | Chien | G03F 7/70916 |
| 10,160,015 | B2 * | 12/2018 | Hirakawa | B08B 13/00 |
| 10,857,570 | B2 * | 12/2020 | Nishiyama | H01L 21/67046 |
| 10,877,382 | B2 * | 12/2020 | Liao | G03F 7/70608 |
| 11,676,844 | B2 * | 6/2023 | Kiyotomi | H01L 21/681 427/256 |
| 12,097,541 | B2 * | 9/2024 | Demura | H01L 21/68728 |
| 2005/0264802 | A1 * | 12/2005 | Shibata | H01L 21/67028 356/237.5 |
| 2006/0291855 | A1 * | 12/2006 | Shigemori | H01L 21/67051 396/611 |
| 2007/0013892 | A1 * | 1/2007 | Osawa | G03F 1/82 355/71 |
| 2007/0146695 | A1 * | 6/2007 | Brouwer | B82Y 10/00 356/237.4 |
| 2008/0204738 | A1 * | 8/2008 | Schupp | G01N 21/9503 356/237.5 |
| 2008/0280054 | A1 * | 11/2008 | Ogata | H01L 21/67051 134/33 |
| 2009/0103079 | A1 * | 4/2009 | Uto | G01N 21/9501 356/237.4 |
| 2009/0126760 | A1 * | 5/2009 | Banerjee | H01L 21/67207 134/1 |
| 2009/0202951 | A1 * | 8/2009 | Yamamoto | B05D 5/06 134/198 |
| 2010/0062348 | A1 * | 3/2010 | Chang | G03F 1/84 430/5 |
| 2011/0285975 | A1 * | 11/2011 | Tawarayama | G03B 27/52 355/30 |
| 2012/0080061 | A1 * | 4/2012 | Kim | H01L 21/67028 34/427 |
| 2012/0247504 | A1 * | 10/2012 | Nasr | H01L 21/67028 134/1.1 |
| 2013/0258300 | A1 * | 10/2013 | Nishiyama | B08B 3/04 15/21.1 |
| 2013/0319457 | A1 * | 12/2013 | Lee | H01L 21/67051 134/1 |
| 2014/0007371 | A1 * | 1/2014 | Lu | H01L 22/12 15/347 |
| 2014/0014138 | A1 * | 1/2014 | Spiegelman | B08B 3/10 134/31 |
| 2014/0146297 | A1 * | 5/2014 | Vainer | G03F 1/84 250/226 |
| 2014/0199784 | A1 * | 7/2014 | Yang | H01L 21/67 438/4 |
| 2014/0206111 | A1 * | 7/2014 | Tanaka | G03F 7/0035 438/694 |
| 2014/0311532 | A1 * | 10/2014 | Yokoyama | H01L 21/68728 134/33 |
| 2015/0264790 | A1 * | 9/2015 | Miyagi | G03F 1/82 378/66 |
| 2016/0221021 | A1 * | 8/2016 | Yang | B05B 17/0623 |
| 2016/0225610 | A1 * | 8/2016 | Chien | G03F 7/70916 |
| 2016/0296982 | A1 * | 10/2016 | Hirakawa | B08B 7/04 |
| 2017/0056936 | A1 * | 3/2017 | Nishiyama | H01L 21/68728 |
| 2017/0115233 | A1 * | 4/2017 | Leem | G01N 21/8851 |
| 2017/0323435 | A1 * | 11/2017 | Minekawa | G06T 7/001 |
| 2018/0195178 | A1 * | 7/2018 | Otsuji | C23F 1/02 |
| 2019/0155158 | A1 * | 5/2019 | Kiyotomi | G03F 7/16 |
| 2019/0162681 | A1 * | 5/2019 | Song | G03F 1/86 |
| 2020/0035483 | A1 * | 1/2020 | Huang | H01L 21/67253 |
| 2020/0057385 | A1 * | 2/2020 | Liao | G03F 1/84 |
| 2020/0133143 | A1 * | 4/2020 | Lan | G03F 9/7019 |
| 2021/0033958 | A1 * | 2/2021 | Kim | G03F 1/22 |

\* cited by examiner

CLEANING METHOD, SEMICONDUCTOR MANUFACTURING METHOD AND A SYSTEM THEREOF

CROSS REFERENCE TO RELATED APPLICATIONS

This application is a divisional of U.S. patent application Ser. No. 16/548,824 filed on Aug. 22, 2019, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs while increasing the amount of functionality that can be provided in the reduced chip area. Such scaling down results in increased complexities of processing and manufacturing ICs, and the processes required for effective quality control of the products have become increasingly stringent.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
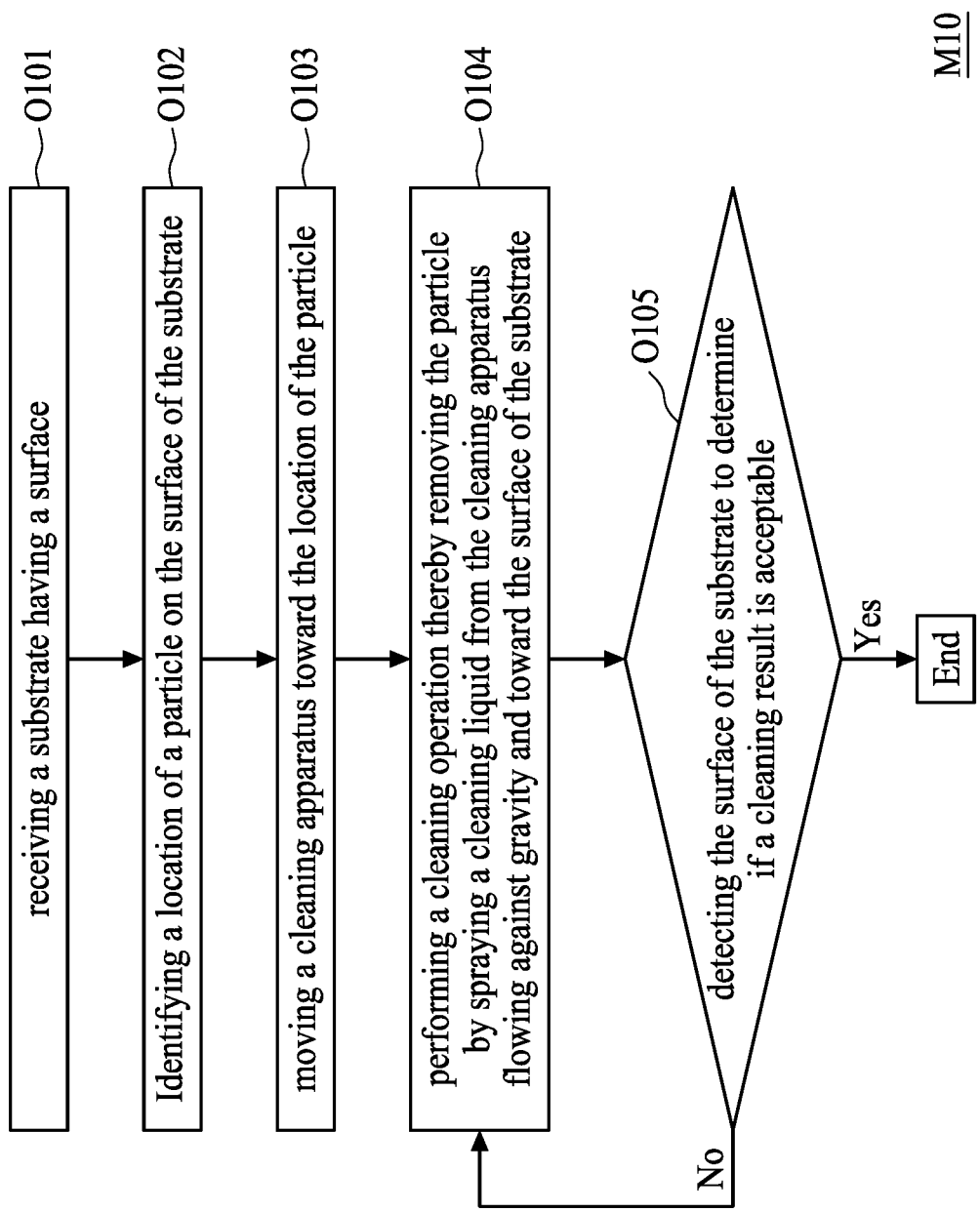
FIG. 1 is a flowchart showing various steps of a cleaning method applied in semiconductor manufacturing in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A lithography process is typically used in a semiconductor device fabrication process whereby the lithographic process transfers patterns of photomasks to a target substrate, typically a semiconductor substrate having a photosensitive layer disposed thereon. If the photomask has a defect or contaminants, the defect or the change in the pattern due to the contaminants is likewise transferred to the target substrate as a defect in the pattern developed onto the substrate. In particular, a high-resolution photomask is susceptible to contamination. There are many causes of the defects or the contaminants. For example, the defects and/or the contaminants can be residues from a manufacturing process of the photomask, precipitated impurities or mist contamination formed by a mask forming process or a lithographic process, and/or damage caused by a cleaning procedure performed on a pellicle of the photomask or pattern features of the photomask. The defect may lead to yield, quality, or reliability issues with the formed semiconductor devices.

The present disclosure provides a cleaning method for cleaning various kinds of substrates, especially the substrates that include fragile features (e.g., a scattering bar of a photomask, a pellicle of a photomask or a circuit of a semiconductor substrate). The cleaning method of the present disclosure can efficiently remove containments, particles, or residues on a surface of the substrate. Damage to the substrate due to the cleaning operation can be significantly reduced, due in part to the upside-down cleaning method of the present disclosure. In addition, the cleaning method can be carried out by one or more electronic devices, and a processing time can be reduced and efficiency can be improved over those of to a conventional manual-cleaning procedure. The cleaning method of the present disclosure can be applied in different stages of a semiconductor fabrication, a photomask fabrication or a regular cleaning procedure of a photomask.

FIG. 1 shows a flowchart of a cleaning method M10 applied in semiconductor manufacturing. The cleaning method M10 includes: (O101) receiving a substrate having a surface; (O102) identifying a location of a particle on the surface of the substrate; (O103) moving a cleaning apparatus toward the location of the particle; and (O104) performing a cleaning operation, thereby removing the particle by spraying a cleaning liquid from the cleaning apparatus against gravity and toward the surface of the substrate. In some embodiments, the method M10 further includes: (O105) detecting the surface of the substrate after the operation O104 to determine if a cleaning result is acceptable. If the cleaning result is not acceptable, the process goes back to the operation (O103); and if the cleaning result is acceptable, the cleaning method M10 ends.

In order to illustrate concepts and the cleaning method M10 of the present disclosure, various embodiments are provided below. However, it is not intended to limit the present disclosure to specific embodiments. In addition, elements, conditions or parameters illustrated in different embodiments can be combined or modified to form different combinations of embodiments as long as the elements, parameters or conditions used are not conflicted. For ease of illustration, reference numerals with similar or same functions and properties are repeatedly used in different embodiments and figures.

FIGS. 2 to 6 are schematic diagrams illustrating the cleaning method M10 in accordance with some embodiments of the present disclosure. A substrate 11 is received or provided, and the substrate 11 has a surface S101. In some embodiments, one or more particles 12 are dropped onto or attached to the surface S101 of the substrate 11 from the environment during transportation from chamber to chamber, while in storage, or during a lithographic process. The particle 12 may include various kinds of materials and various kinds of configurations. In some embodiments, the particle 12 includes organic materials. In some embodiments, the particle 12 includes inorganic compounds. In some embodiments, the particle 12 includes residues from a previous operation. In some embodiments, the particle 12 is a relatively flat object attached to the surface S101 of the substrate 11, such as the particle 12a shown in FIG. 2. In some embodiments, the particle 12 is more of a bulging object attached to and protruding from the surface S101 of the substrate 11, such as the particle 12b shown in FIG. 2.

Figure 2:
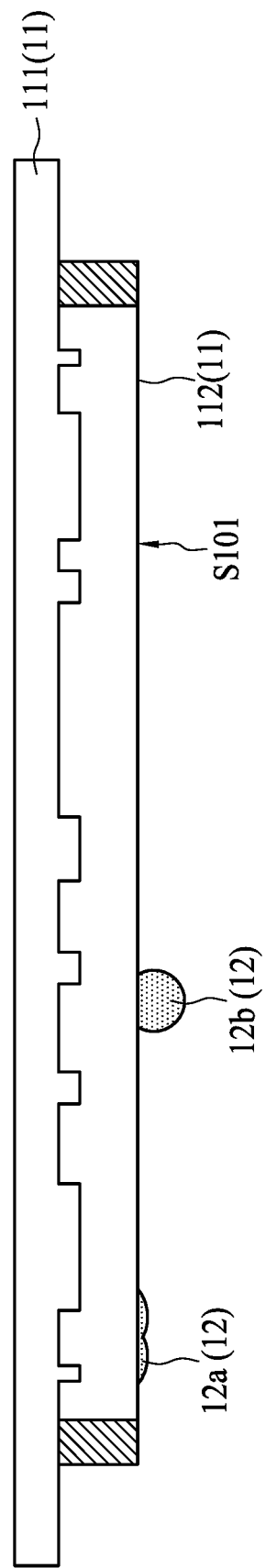
FIGS. 2 to 5 are schematic diagrams of various steps of a cleaning method in accordance with some embodiments of the present disclosure.

In some embodiments as shown in FIG. 2, the substrate 11 is a photomask including a photomask substrate 111 and a pellicle 112, wherein the surface S101 is an outer surface of the pellicle 112 facing away from the photomask substrate 111. The pellicle 112 is connected to the photomask substrate 111, for instance, through a frame structure. In some embodiments, the photomask substrate 111 includes a transparent plate (e.g., glass or quartz) and a pattern formed on the transparent plate. In some embodiments, the pellicle 112 covers an entire pattern of the photomask substrate 111 and the frame structure encircles the entire pattern of the photomask substrate 111. FIG. 2 shows the photomask substrate 111 as an integrated structure without specifically showing different parts of the transparent plate and the pattern for ease of illustration but is not intended to limit the present disclosure. In some embodiments as shown in FIG. 2, several particles 12 with different configurations are attached to the outer surface of the pellicle 112.

In some embodiments, the operation O102 is performed after the operation O101, and a location of the particle 12 on the surface S101 of the substrate 11 is identified after receiving the substrate 11. In some embodiments, the operation O102 includes moving a particle recognizer 13 toward the surface S101 of the substrate 11.

Figure 3:
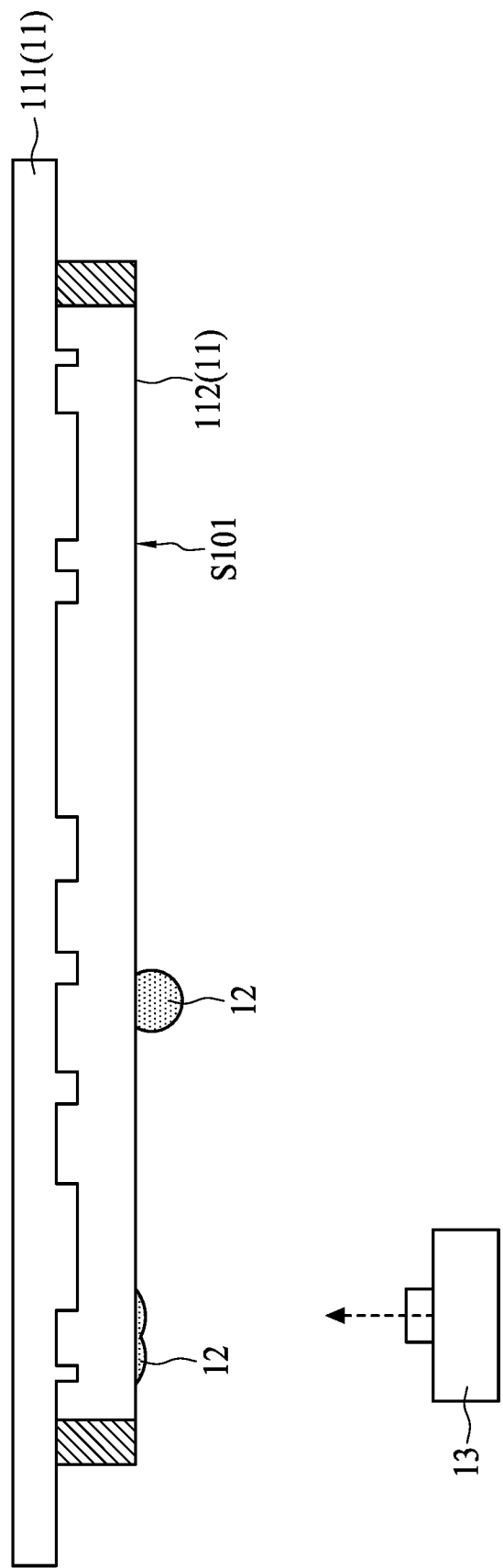

In some embodiments, the particle recognizer 13 includes a camera. In some embodiments, the particle recognizer 13 is moved toward the surface S101 of the substrate 11 to a position facing the surface S101 with an angle from 0 to 90 degrees (substantially parallel or vertical to the surface S101). In some embodiments as shown in FIG. 3, the particle recognizer 13 is moved toward the surface S101 of the substrate 11 to a position facing directly toward the surface S101 to capture a clear image of the entire surface S101 of the substrate 11. In some embodiments, locations of the particles 12 are identified according to the clear image of the entire surface S101 captured. In some embodiments, the particle recognizer 13 is then moved toward each of the locations of the particles 12, and images of the particles 12 are captured from a tilt angle to the surface S101 in order to recognize configurations of the particles 12. In some embodiments, the particle recognizer 13 is an optical microcamera, utilized in applications in which it is important to have imaging systems with extreme small sizes in combination with highest image quality. In some embodiments, the particle recognizer 13 is a scanner. In some embodiments, the particle recognizer 13 is moved to scan the entire surface S101 of the substrate 11. In some embodiments, the operation O102 further includes acquiring an image of the surface S101 of the substrate 11 by the particle recognizer 13. In some embodiments, an image recognition is performed by a processor on the acquired image of the surface S101. Conventional techniques can be applied in the image acquiring operation and the image recognition, and are not limited herein.

In some embodiments, the particle recognizer 13 includes a signal projector and a signal acceptor (not shown in FIG. 3). In some embodiments, the signal projector and the signal acceptor are capable of projecting and receiving signals including optical signals, laser, electron beam, infrared light, or other suitable types of signals. In some embodiments, the operation O102 is achieved by measuring intensities or wavelengths of reflected lights across the surface S101 of the substrate 11. In some embodiments, the operation O102 includes irradiating the surface S101 of the substrate 11 with a light beam, wherein the light beam is generated by the signal projector. In some embodiments, a reflected light of the light beam reflected from the surface S101 of the substrate 11 is detected or received by the signal acceptor. In some embodiments, an intensity and/or a wavelength of the reflected light is measured in order to identify the location of the particle 12 on the surface S101 of the substrate 11. In some embodiments, the measurement and/or identifying of the location of the particle 12 are performed by a processor electrically or communicatively connected to the signal acceptor.

In some embodiments, a wavelength of the reflected light reflected from a clean surface of the pellicle 112 is measured and saved as a reference. In some embodiments, the particle 12 absorbs a portion of the light beam and the reflected light has a wavelength different from the reference. In some embodiments, the wavelength of the reflected light is detected and compared to the reference to identify the presence and the location of the particle 12 if a difference between the two wavelengths of the reference and the reflected light exceeds a threshold. In some embodiments, the wavelength of the reflected light is detected and compared to the wavelength of the light beam instead of a saved reference, and if the difference between the two exceeds a threshold, the presence and the location of the particle 12 can be identified.

In some embodiments, an intensity of the light reflected from the clean surface of the pellicle 112 is measured as a reference. In some embodiments, the particle 12 diffracts the light beam in various directions and thus an intensity of the reflected light detected at the location of the particle 12 is less than the reference. In some embodiments, the intensity of the reflected light is detected and compared to the reference to identify the presence and the location of the particle 12. In some embodiments, the intensity of the reflected light is detected and compared to the intensity of the light beam instead of the reference, and if the difference between the two exceeds a threshold or a value, the presence and the location of the particle 12 can be identified. In some embodiments, in the operation O102, a configuration (e.g., flat or bulging) and a size of the particle 12 are also identified and categorized.

Figure 4:
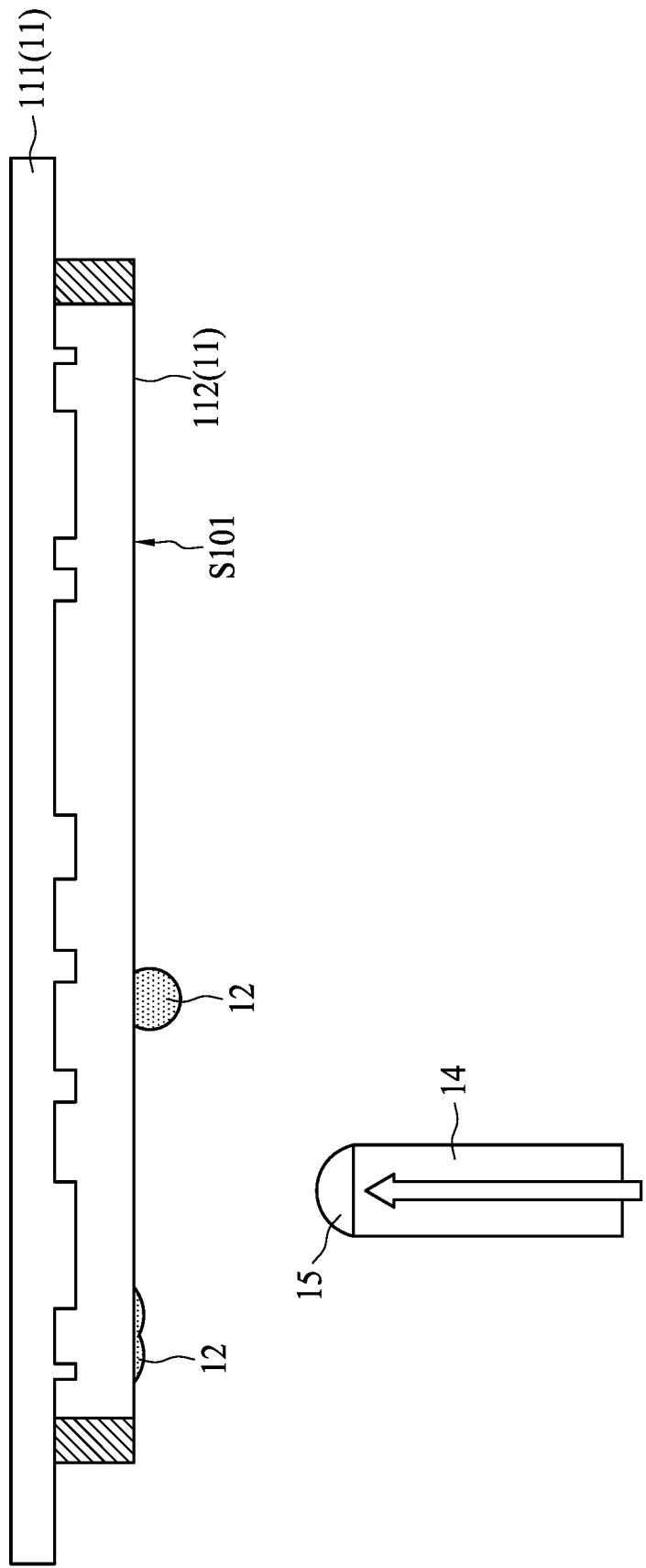

In some embodiments as shown in FIG. 4, the operation O103 is performed after the operation O102, and a cleaning apparatus 14 is moved toward the location of the particle 12 after the location of the particle 12 is identified. In some embodiments, prior to the operation O103, the particle recognizer 13 is moved away from the substrate 11. In some embodiments, the cleaning apparatus 14 includes a nozzle, connected to a liquid tank, for spraying a cleaning liquid 15 toward the surface S101 of the substrate 11. The arrow shown in the cleaning apparatus 14 of the FIG. 4 is to illustrate a flow direction of the cleaning liquid 15 in the subsequent operation O104. In some embodiments, the cleaning apparatus 14 is moved into alignment with the particle 12 so that the particle 12 can be removed by direct physical impact of the cleaning liquid 15 in the subsequent operation S104. In some embodiments, the cleaning apparatus 14 is moved toward the location and targets a peripheral region around the particle 12 on the surface S101 so that the particle 12 can be removed by physical impact of the cleaning liquid 15 from a direction along the surface S101 of the substrate 11 in the subsequent operation S104. In some embodiments, the cleaning apparatus 14 is placed to be perpendicular to the substrate 11 so that the cleaning liquid 15 can be sprayed vertically toward the surface S101 in the operation S104, but the disclosure is not limited thereto. In some embodiments, the cleaning apparatus 14 can be tilted, and the cleaning liquid 15 can be sprayed toward the surface S101 with an angle. In some embodiments, the cleaning apparatus 14 is placed to adjust a spray direction of the cleaning liquid 15 in the subsequent operation O104 toward an edge of an interface between the surface S101 and the particle 12. In some embodiments, the cleaning apparatus 14 is moved to a distance from the location of the particle 12 in a range of 0.1 to 2 cm to provide enough physical force to remove the particle 12 without damage the pellicle 112 in the subsequent operation O104.

Figure 5:
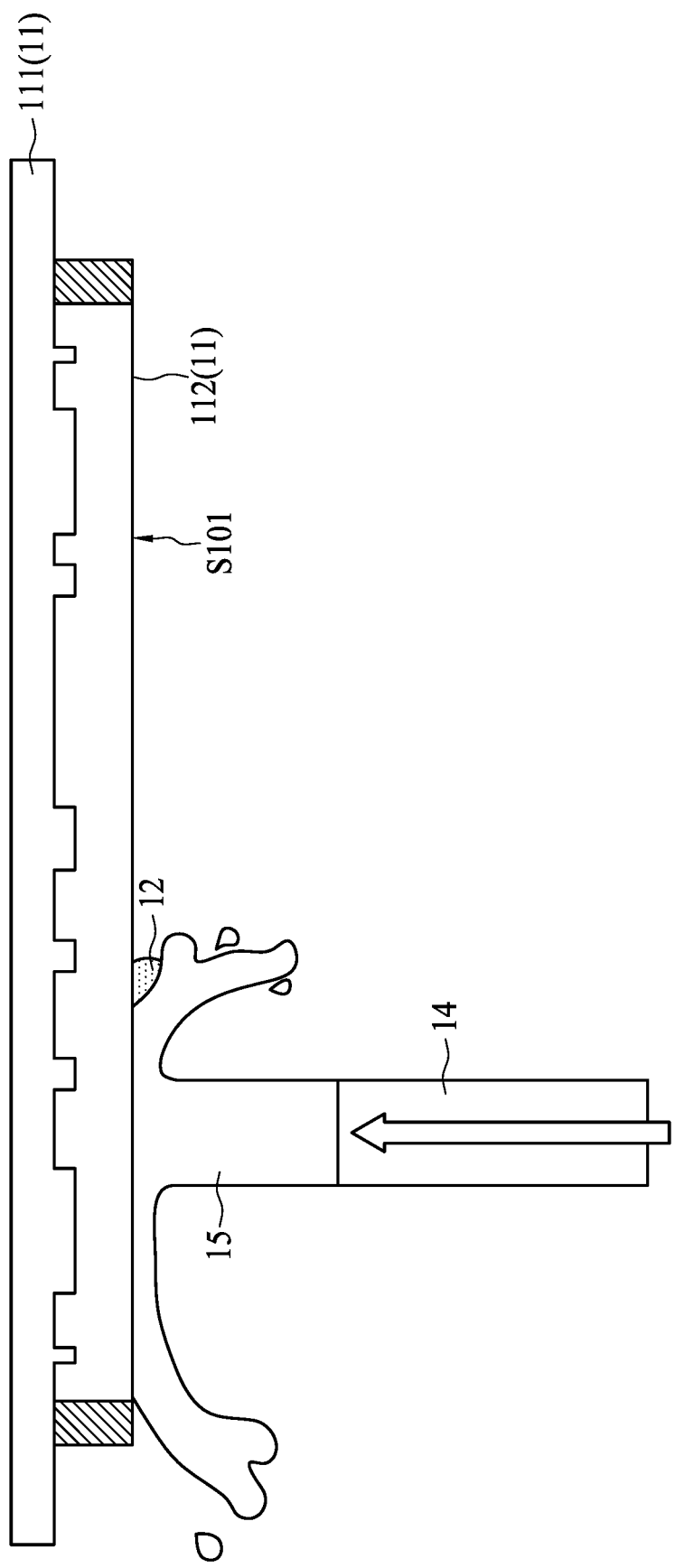

FIG. 5 shows a schematic diagram illustrating the operation O104 of the cleaning method M10 in accordance with some embodiments of the present disclosure. In some embodiments, the operation O104 is performed after the operation O103, and includes a cleaning operation performed to remove the particle 12 by the cleaning liquid 15 flowing against gravity and toward the surface S101 of the substrate 11 from the cleaning apparatus 14. In some embodiments as shown in FIG. 5, the cleaning liquid 15 is sprayed out from the cleaning apparatus 14 in a direction opposite to a direction of gravity and in contact with the surface S101 at a position adjacent to the location of the particle 12. However, the present disclosure is not limited thereto. As illustrated in the previous paragraph, an angle between the surface S101 and the direction of the spray of the cleaning liquid 15 can be adjusted, and a contacting position of the cleaning liquid 15 on the surface S101 can also be adjusted according to different applications and requirements. In some embodiments, the cleaning operation is performed at or around the location of the particle 12. In some embodiments, the cleaning operation is performed on the entire surface S101 of the substrate 11 including the location of the particle 12. In some embodiments, the cleaning operation is performed targeting the location of the particle 12 and then the entire surface S101 to ensure the particle 12 does not become attached to another location of the surface S101.

In order to control a force of the physical impact of the cleaning liquid 15 on the surface S101, a flow rate of the cleaning liquid 15 sprayed from the cleaning apparatus 14 is controlled in a range of 10 to 100 ml/min (milliliters per minute) by tuning an inner diameter of an aperture of the cleaning apparatus 14. In some embodiments, the flow rate of the cleaning liquid 15 correlates to the inner diameter of the aperture of the cleaning apparatus 14. In some embodiments, the flow rate of the cleaning liquid 15 increases with an increase of the inner diameter of the aperture of the cleaning apparatus 14. In some embodiments, the flow rate of the cleaning liquid 15 increases with an increase of the distance between the cleaning apparatus 14 and the surface S101. In some embodiments, the inner diameter of the aperture of the cleaning apparatus 14 is in a range of 1 to 10 mm. In some embodiments, a pressure of the cleaning liquid 15 applied on the surface S101 is in a range of 0.900 to 1.501 bar. In some embodiments, the pressure of the cleaning liquid 15 in contact with the surface S101 is in a range of 1.011 to 1.015 bar. In some embodiments, damage to the surface S101 of the substrate 11 (e.g., the outer surface of the pellicle 112 of the photomask 11) is reduced due to the upside-down cleaning procedure of the substrate 11, the anti-gravity spray direction of the cleaning liquid 15 in the cleaning operation, and the control of the flow rate of the cleaning liquid 15. In some embodiments, a crack or a hole on the pellicle 112 of the photomask 11 resulted from the cleaning operation can be prevented as a strength of the impact of the cleaning operation to the surface S101 can be well controlled attributed to the comprehensive advantages of the gravity on the anti-gravity spray direction of the cleaning liquid 15.

In some embodiments, the cleaning operation may include different cleaning techniques or cleaning procedures. The cleaning operation may include at least one of mega-sonic cleaning, UV-exposed liquid cleaning and chemical cleaning. The mega-sonic cleaning of the present disclosure refers to a type of acoustic cleaning, wherein a transducer of the cleaning apparatus 14 creates an acoustic field at a frequency higher than that of a conventional ultrasonic cleaning (in a scale of kHz). In some embodiments, an energy of the mega-sonic cleaning is in a range of 1 to 15 W (watts). The UV-exposed liquid cleaning of the present disclosure refers to a cleaning procedure in which the cleaning liquid 15 flows through a radiation source or an ultraviolet lamp and is then delivered to the surface S101. In some embodiments, at least one UV lamp is arranged in a nozzle of the cleaning apparatus 14 where the cleaning liquid 15 flows through before being sprayed out. In some embodiments, a wavelength of light used in the UV-exposed liquid cleaning is in a range of 200 to 400 nm (nanometers) for a purpose of producing radicals in the cleaning liquid 15 to facilitate removal of the particle 12. The chemical cleaning of the present disclosure refers to a cleaning procedure using a basic or acidic chemical as the cleaning liquid 15. The $H^+$ and/or $OH^-$ in the chemical cleaning can disturb the Van der Waals force, which can be a major force causing the particle 12 attracted on the surface S101.

In some embodiments, the different cleaning procedures or techniques target different types (e.g., different configurations and/or different materials) of the particle 12. In some embodiments, the particle 12 having a bulging configuration (e.g., the particle 12b in FIG. 2) is subjected to the mega-sonic cleaning and/or UV-exposed liquid cleaning. In some embodiments, the particle 12 having a flat configuration (e.g., the particle 12a in FIG. 2) is subjected to the chemical cleaning. In some embodiments, the particle 12 having organic materials is subjected to the mega-sonic cleaning, the chemical cleaning and/or UV-exposed liquid cleaning. In some embodiments, the particle 12 having a higher carbon weight percentage is subjected to the UV-exposed liquid cleaning. In some embodiments, the cleaning procedure or technique used is selected based on a material of the surface S101 of the substrate 11.

In some embodiments, the cleaning liquid 15 includes at least one of deionized water (referred to as DIW), deionized water with deionized water bubbles (referred to as DI+DIB), ozonated deionized water (deionized water mixed with ozone, referred to as DI+$O_3$), deionized water with hydrogen bubbles (referred to as DI+$H_2$), deionized water with oxygen radicals (referred to as DI+O), sulfuric acid, and tetramethylammonium hydroxide (abbreviated as TMAH). In some embodiments, a concentration of the TMAH used in the chemical cleaning is in a range of 1 to 20 wt % (weight percent). In some embodiments, a concentration of the sulfuric acid used in the chemical cleaning is in a range of 80 wt % to less than 100 wt %. In some embodiments, the sulfuric acid is diluted by hydrogen peroxide. In some embodiments, the oxygen radicals in DI+O are generated from the ozone in the DI+$O_3$. In some embodiments, the DI+$O_3$ is used in the UV-exposed liquid cleaning, and the radiation source provides energy to the DI+$O_3$, thereby causing the irradiated DI+$O_3$ or the UV-exposed DI+$O_3$ to become DI+O and to contain oxygen radicals. In some embodiments, the DI+O applied in UV-exposed cleaning can facilitate removal of the organic particle 12 by oxidization.

In order to further illustrate the cleaning operation using different techniques and different cleaning liquid 15, FIGS. 6 to 9 shows the operation O104 according to different embodiments.

Figure 6:
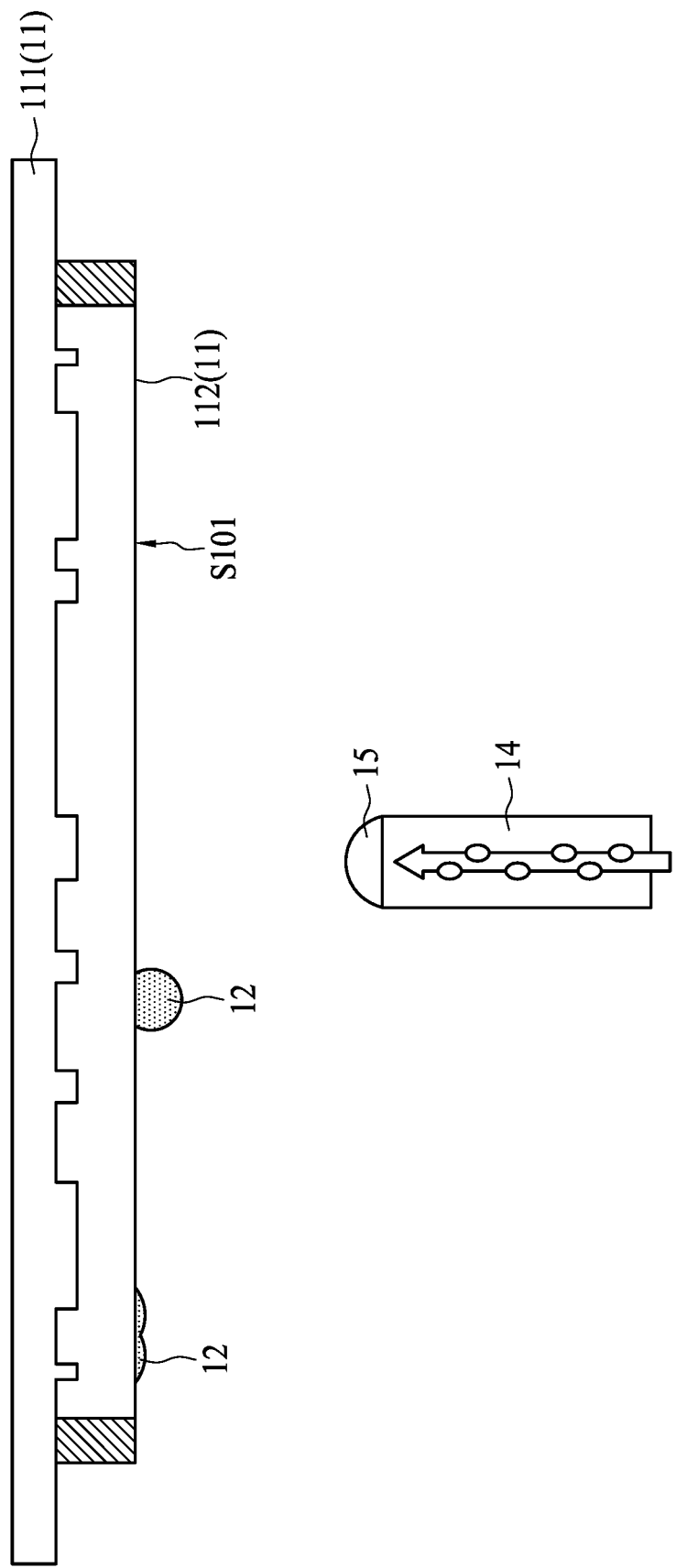
FIGS. 6 to 8 are schematic diagrams of one or more steps of a cleaning method in accordance with different embodiments of the present disclosure.

The cleaning liquid 15 used in the embodiments may not include bubbles (the cleaning liquid 15 may include one or more of DIW, DI+$O_3$, DI+O, sulfuric acid and TMAH). In some embodiment as shown in FIG. 6, the cleaning liquid 15 includes bubbles to enhance physical forces. For instance as shown in FIG. 6, the cleaning operation may include mega-sonic cleaning with DI+DIB (the circles in the cleaning apparatus 14 in FIG. 6 indicate deionized water bubbles in the cleaning liquid 15).

Figure 7:
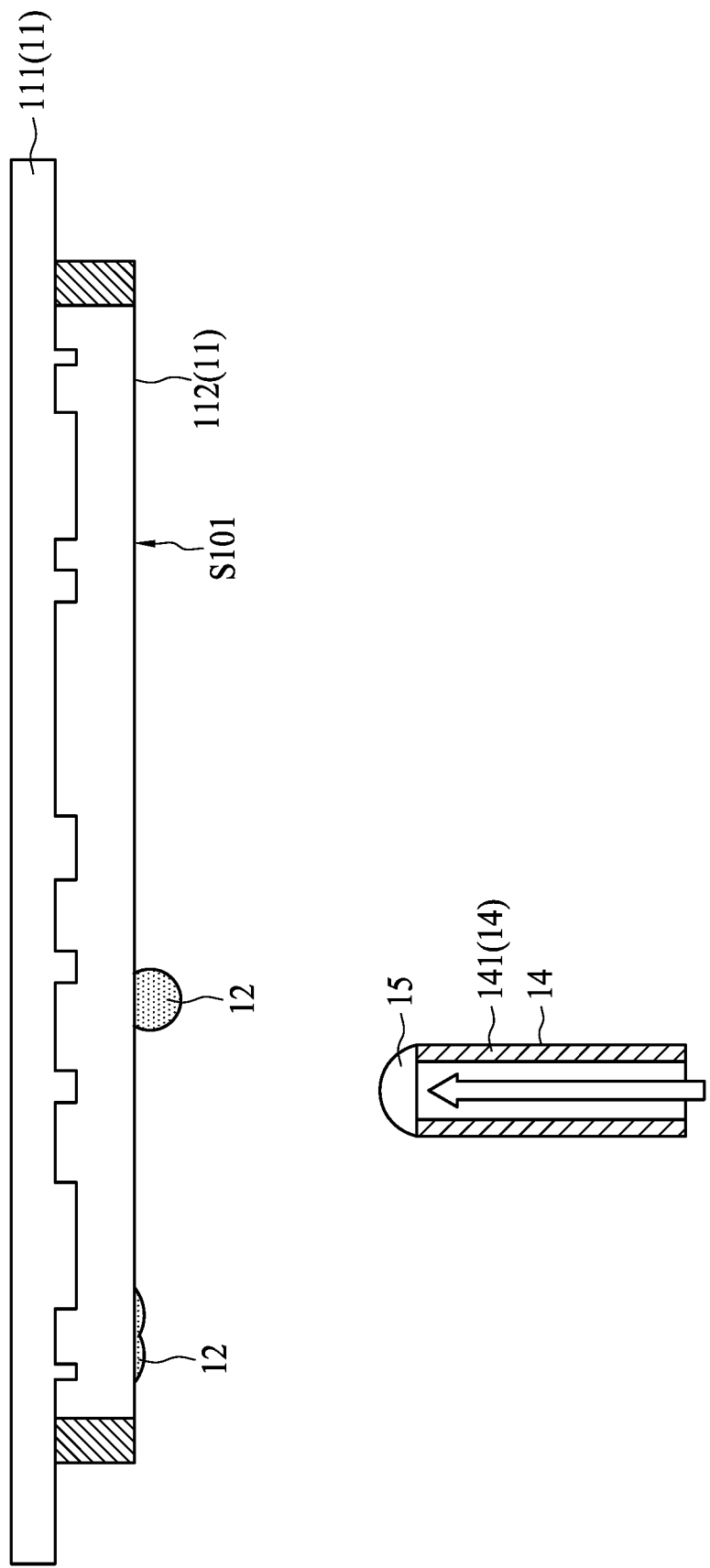

In some embodiments as shown in FIG. 7, the cleaning apparatus 14 includes at least one radiation source 141 (e.g., a UV lamp) arranged in a pathway of the cleaning liquid 15 before the cleaning liquid 15 is sprayed out from the cleaning apparatus 14. In some embodiments, the radiation source 141 is at an inner surface of a nozzle of the cleaning apparatus 14. For example as shown in FIG. 7, the particles 12 having a higher carbon weight percentage are targeted to the UV-exposed cleaning with DI+$O_3$ or DIW.

Figure 8:
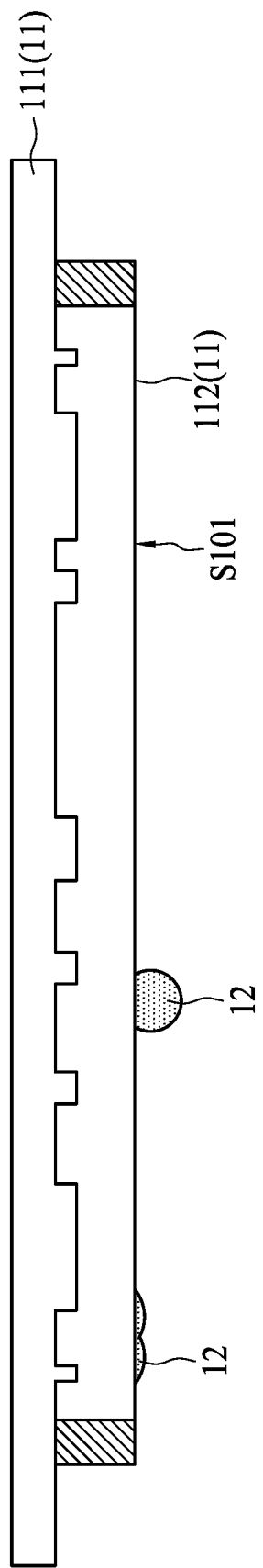
Figure 8:
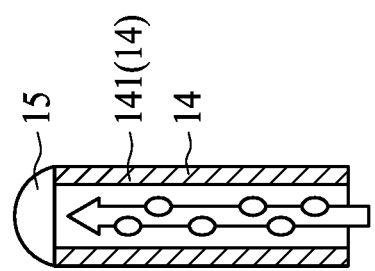

Similar to the embodiments shown in FIG. 7, in order to enhance physical forces and improve cleaning efficiency, the cleaning liquid 15 can include bubble. In some embodiments as shown in FIG. 8, the cleaning operation may include UV-exposed liquid cleaning with DI+$H_2$ (the circles in the cleaning apparatus 14 in FIG. 8 indicate deionized water bubbles in the cleaning liquid 15).

Figure 9:
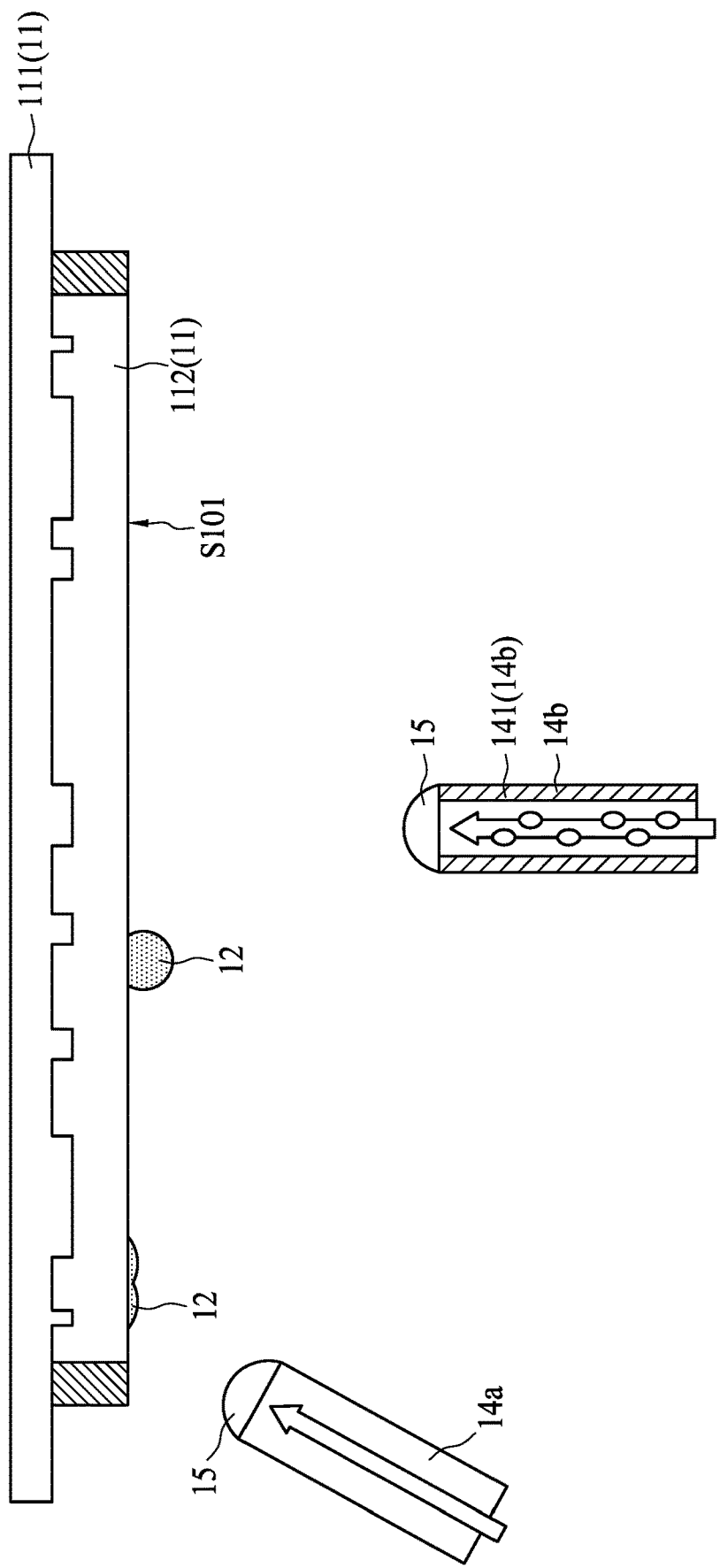
FIG. 9 is a schematic diagram of one or more steps of a cleaning method in accordance with some embodiments of the present disclosure.

In some embodiments as shown in FIG. 9, the cleaning operation including moving more than one cleaning apparatuses 14 toward the locations of the particles 12. For a purpose of illustration, the cleaning apparatus 14 on the left side is relabeled to 14a, and the cleaning apparatus 14 on the right side is relabeled to 14b. For example as shown in FIG. 9, some of the particles 12 with flat configurations and/or organic materials are targeted to the chemical cleaning with sulfuric acid by the cleaning apparatus 14a with a tilt angle in order to enhance removal efficiency, and some of the particles 12 with bulging configurations are targeted to the US-exposed liquid cleaning with DI+$H_2$ (the circles in the cleaning apparatus 14 in FIG. 9 indicate deionized water bubbles in the cleaning liquid 15). In some embodiments as shown in FIG. 9, the cleaning apparatuses 14a and 14b can have different distance to the surface S101 of the substrate 11.

Therefore, different techniques, different cleaning procedures, different cleaning liquids 15, and different cleaning apparatuses 14 can be combined according to different types or materials of the particles 12 in order to efficiently remove the particles 12 from the substrate 11. For a purpose of illustration, the cleaning apparatus 14 and the cleaning liquid 15 as shown in FIG. 4 are used in the following figures and description.

Figure 10:
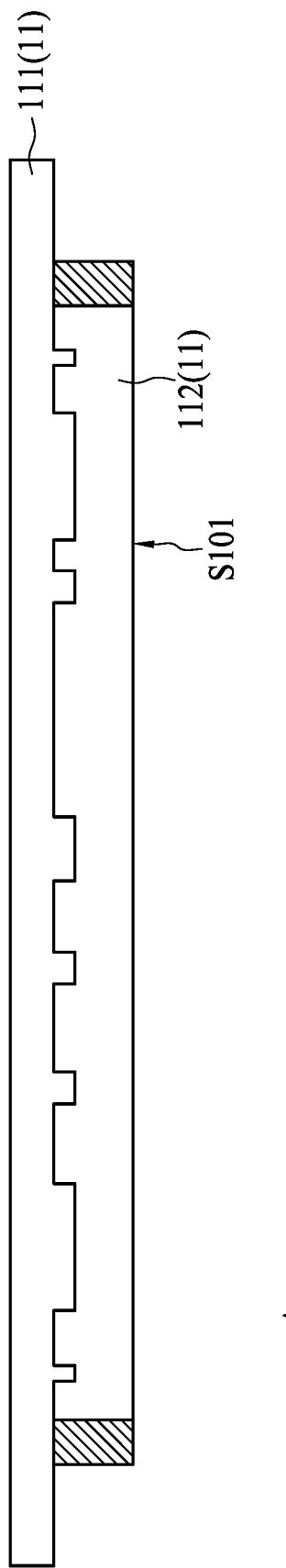
FIG. 10 is a schematic diagram of one or more steps of a cleaning method in accordance with some embodiments of the present disclosure.

In some embodiments as shown in FIG. 10, the cleaning method M10 further includes the operation O105 of to detect the particle 12 on the surface S101 of the substrate 11 after the cleaning operation of the operation O104. In some embodiments, the detection operation includes moving a particle recognizer 13' toward the surface S101 of the substrate 11. In some embodiments, the particle recognizer 13' used in the detection operation is similar to or the same as the particle recognizer 13 used in the operation O102. In some embodiments, the particle recognizer 13' detects the location where the particle 12 previously found instead of the entire surface S101. In some embodiments, the particle recognizer 13' detects both the location where the particle 12 previously found and the entire surface S101. In some embodiments, prior to the operation O105, the cleaning method M10 further includes moving away the cleaning apparatus 14 from the substrate 11.

In accordance with some embodiments, a cleaning result is determined in the operation O105. The cleaning result can be different according to different embodiments, different applications, or different generations of technologies, and it is not limited herein. If the cleaning result is acceptable, the cleaning method M10 ends, but if the cleaning result is not acceptable (e.g. the particle 12 detected previously is not removed or only partially removed, or the particle 12 is moved from the location originally detected but attached to other location of the surface S101), the cleaning operation in the operation O104 is performed. Detailed procedures can be similar to the illustration above regarding the operation O102, a location of the particle 12 is identified in the operation O105. For instance, the location of the particle 12 can be identified by an image taken in the operation O105 by the particle recognizer 13'.

In some embodiments, multiple cleaning operations can be performed. The cleaning operation as illustrated in the operation O104 is performed again after the operation O105 if the cleaning result is not acceptable. For ease of illustration, the cleaning operation performed in the operation O104 is referred to as a first cleaning operation, and the cleaning operation performed after the detecting operation in the operation O105 is referred to as a second cleaning operation. In some embodiments, the particle 12 is not removed at all in the first cleaning operation, and the second cleaning operation using a different cleaning apparatus 14 and/or a different cleaning liquid 15 is performed after the operation O105. In some embodiments, the first cleaning operation includes the mega-sonic cleaning, and the second cleaning operation includes UV-exposed liquid cleaning. In some embodiments, the first cleaning operation uses DI+DIB, and the second cleaning operation uses TMAH. In addition, a duration of the second cleaning operation can be different from a duration of the first cleaning operation.

In some embodiments, the particle 12 is partially removed by the first cleaning operation, and a portion of the particle 12 (or a smaller particle 12) is detected in the operation O105 and the cleaning result is not acceptable. The second cleaning operation is performed, and the duration of the second cleaning operation is less than the duration of the first cleaning operation. In some embodiments, the particle 12 is not removed at all in the first cleaning operation, and the duration of the second cleaning operation is longer than or equal to the duration of the first cleaning operation. For instance, a duration of a single cleaning operation is in a range of 5-300 seconds, and the duration of the second cleaning operation can be adjusted based on the detection of the operation O105. In some embodiments, durations and times of the cleaning operation to different materials and/or configurations of the particle 12 are recorded as a feedback for further adjustment.

In accordance with some embodiments of the present disclosure, the cleaning method M10 is applied to the pellicle 112 of the photomask 11 as described in the previous paragraphs and illustrated in FIGS. 2 to 5 and 10. The cleaning method M10 can efficiently remove particles 12 on the surface S101 and effectively reduce damage to the pellicle 112 due to the cleaning operation. In addition, the cleaning method M10 can be carried out by one or more electronic devices, and processing time can be reduced and efficiency can be improved over those of a conventional manual-cleaning procedure. The cleaning method M10 of the present disclosure can also be applied in different stages of a semiconductor fabrication, a photomask fabrication or a regular photomask cleaning procedure. In accordance with different applications of the cleaning method M10, the substrate 11 can refer to the pellicle 112 of the photomask as illustrated above, the photomask substrate 111 of the photomask, or a semiconductor substrate.

Figure 11:
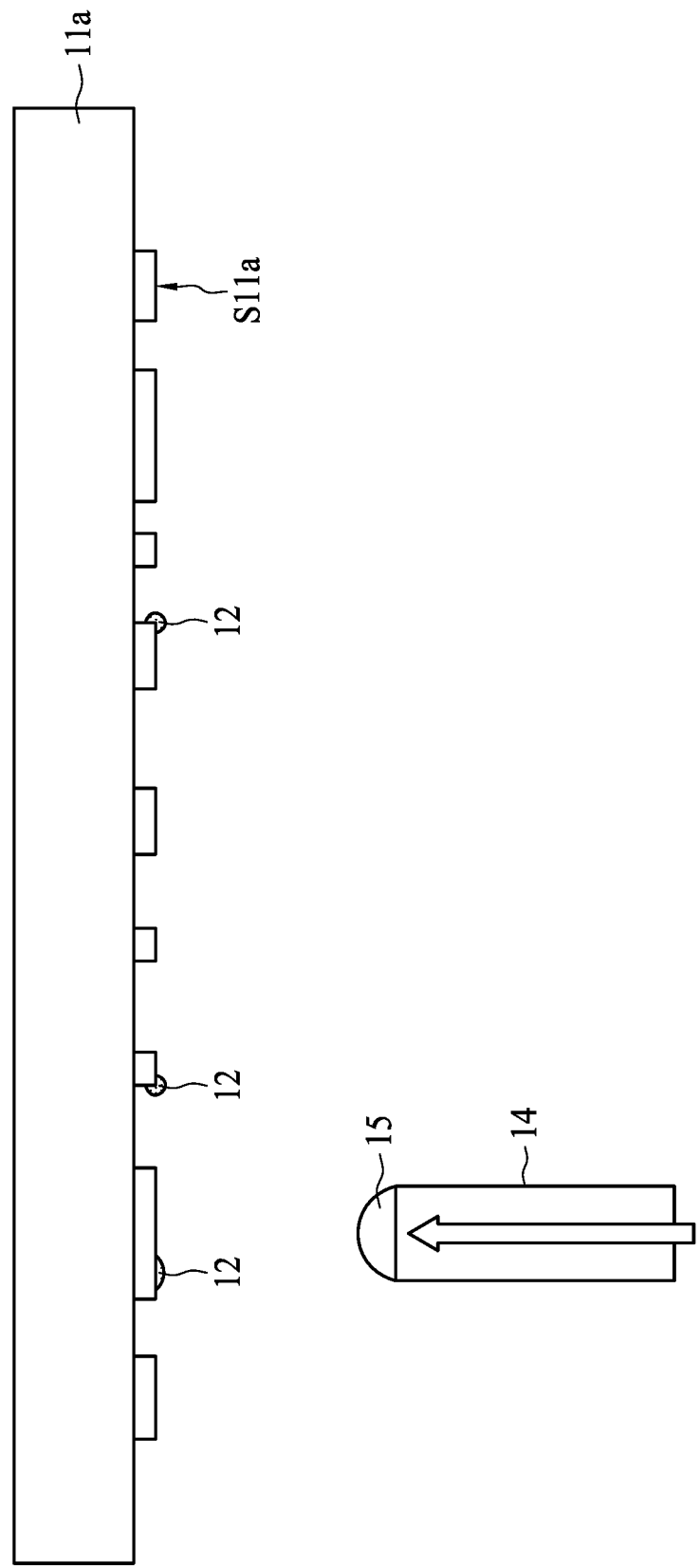
FIGS. 11 to 12 are schematic diagrams of a cleaning method applied to different substrates in accordance with some embodiments of the present disclosure.
Figure 12:
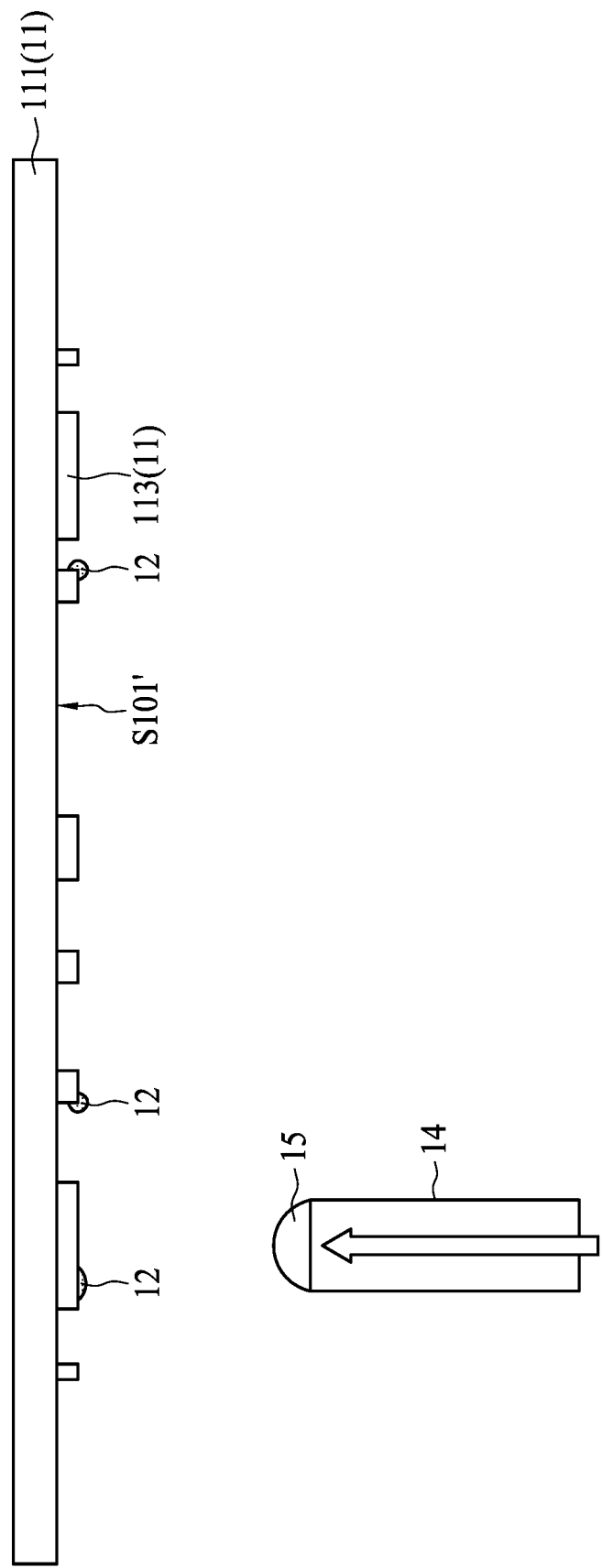

FIGS. 11 to 12 show schematic diagrams in accordance with other embodiments. For ease of illustration and understanding, in the following specification, only differences from the previously illustrated embodiments are provided, and similar features or applications of similar techniques are omitted for a purpose of brevity.

In some embodiments as shown in FIG. 11, the substrate 11 is a semiconductor substrate, and the cleaning method M10 is applied in semiconductor manufacturing. In some embodiments, the substrate 11 is referred to as a semiconductor substrate 11a, and the surface S101 is a top surface S11a of the semiconductor substrate 11a or a top surface S11a of a patterned layer over the semiconductor substrate 11a. The top surface S11a can be also referred to as a patterned surface S11a. In some embodiments, the particle 12 is residue from one or more previous operations in the semiconductor manufacturing process. In some embodiments, the operations O102 to O104 are performed after a lithographic and/or an etching processes on the semiconductor substrate 11a. The cleaning method M10 of the present disclosure can be applied in any cleaning stage of the semiconductor manufacturing process. In some embodiments the operations O102 to O104 performed after the lithographic process. For example, the operations O102 to O104 are performed on a top surface S11a of a patterned photoresist layer over the semiconductor substrate 11a. In some the operations O102 to O104 performed after the etching process. For example, the operations O102 to O104 are performed on a top surface S11a of a patterned target layer, such as a patterned hard mask layer or a patterned material layer, over the semiconductor substrate 11a.

In some embodiments as shown in FIG. 12, the substrate 11 is a photomask substrate 111 of a photomask, and the cleaning method M10 is applied in photomask manufacturing or a maintenance procedure of the photomask. In some embodiments, the surface S101 of the substrate 11 is a top surface S101' of a pattern 113 of the photomask substrate 111 facing a pellicle 112 (to be mounted on the photomask substrate 111) of the photomask. The top surface S101' can also be referred to as a patterned surface S101'. In some embodiments shown in FIG. 12, the pattern 113 is defined by a patterned shielding layer on a transparent plate of the photomask substrate 111. One or more particles 12 are on the top surface S101' of the photomask substrate 111, and the operations O102 to O104 are performed on the photomask substrate 111.

In some embodiments, damage to the surface S101 of the substrate 11 (e.g. the top surface S101' of the photomask substrate 111) is reduced due to the upside-down cleaning procedure of the substrate 11, the anti-gravity spray direction of the cleaning liquid 15 in the cleaning operation, and the control of the flow rate of the cleaning liquid 15. In some embodiments, broken or missing scattering bars of the photomask substrate 111 resulted from the cleaning operation can be prevented attributed to the comprehensive advantages of the gravity on the anti-gravity spray direction of the cleaning liquid 15.

In some embodiments, the cleaning method M10 is applied in the photomask manufacturing process. In some embodiments, an operation of patterning the photomask substrate 111 to form the pattern 113 is performed prior to the operations O102 to O105. In some embodiments, an operation of attaching the pellicle 112 of the substrate 11 (e.g., the photomask in some embodiments) to the photomask substrate 111 is performed after the operation O105 if the cleaning result is acceptable, thereby forming the photomask similar to the substrate 11 shown in FIG. 2. The cleaning method M10 is applied in order to remove the particle 12 that results from the lithographic process and/or the etching process for forming the pattern 113.

In some embodiments, when the cleaning method M10 is applied during the maintenance procedure (e.g., a routine cleaning procedure) of the photomask, the cleaning method M10 further includes removing the pellicle 112 from the photomask substrate 111 of the photomask after the operation O101. In some embodiments, the cleaning method M10 further includes exposing the top surface S101' of the photomask substrate 111 prior to the operation O102, wherein the particle 12 is on the top surface S101' of the photomask substrate 111. The cleaning method M10 is applied for removal of the particle 12 that passes through a filter (not shown) on the frame structure of the photomask, for instance, during a lithographic process performed for transferring the pattern 113 to a semiconductor substrate or a layer over the semiconductor substrate.

Figure 13:
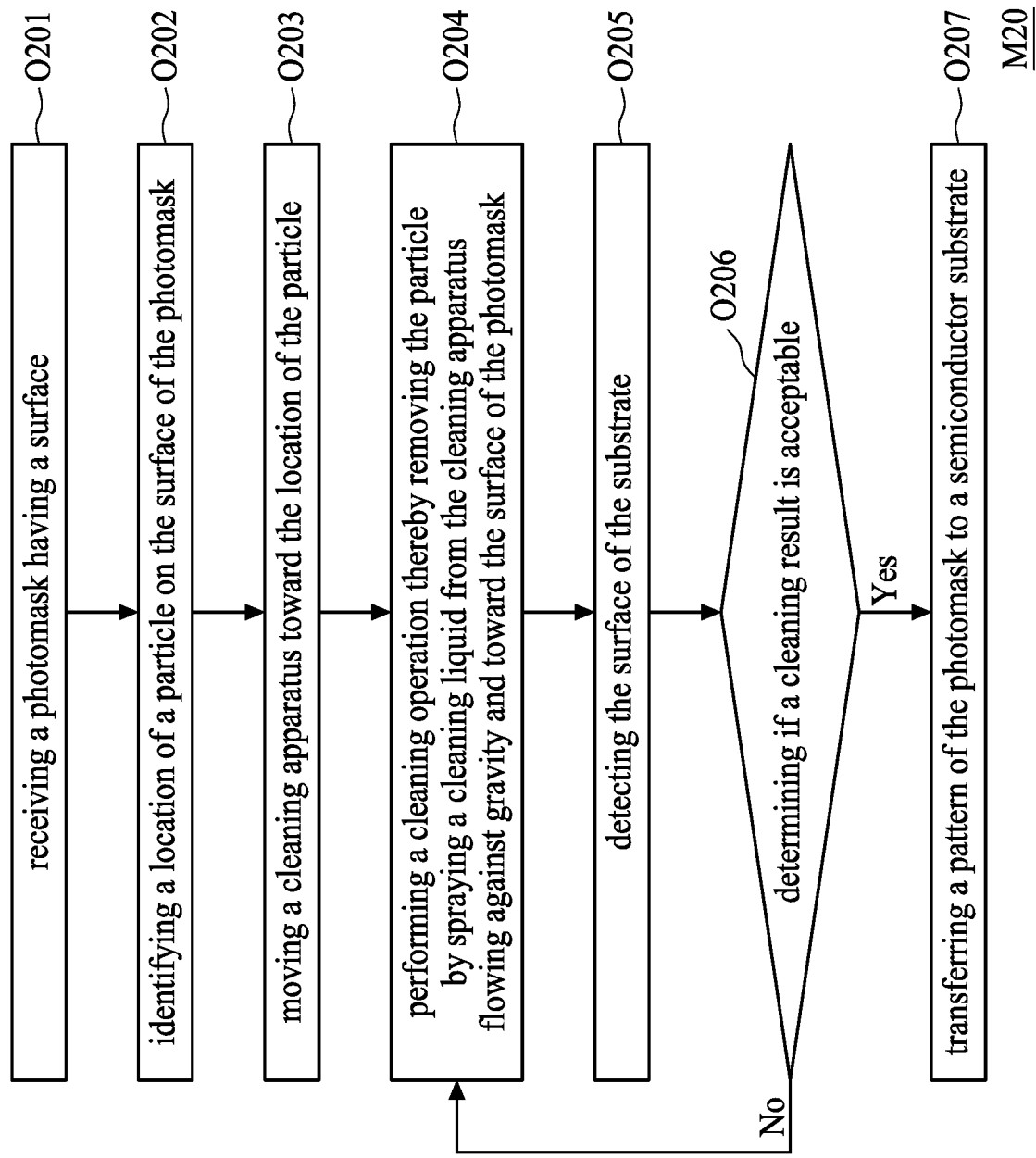
FIG. 13 is a flowchart showing various steps of a semiconductor manufacturing method in accordance with some embodiments of the present disclosure.

In accordance with some embodiments of the present disclosure, a semiconductor manufacturing method M20 incorporating the cleaning method M10 is provided. FIG. 13 is a flowchart illustrating the method M20. The method M20 includes: (O201) receiving a photomask having a surface; (O202) identifying a location of a particle on the surface of the photomask; (O203) moving a cleaning apparatus toward the location of the particle; (O204) performing a cleaning operation, thereby removing the particle by spraying a cleaning liquid from the cleaning apparatus flowing against gravity and toward the surface of the photomask; and (O207) transferring a pattern of the photomask to a semiconductor substrate. In some embodiments, similar to the cleaning method M10, an operation O205 of detecting the surface of the substrate after the operation O104 and an operation O206 of determining if a cleaning result is acceptable are optionally included in the method M20 depending on different embodiments. The operations O201 to O206 are similar to the operations O101 to O105, and repeated illustration is omitted herein. In some embodiments, the operations O201 to O204 (or O201 to O206) are performed prior to the operation O207. In some embodiments, the operations O201 to O204 (or O201 to O206) are performed after the operation O207. In some embodiments the operation O207 is performed prior to the operations O201 to O206, the process goes forward to a next procedure or ends depending on different applications.

In some embodiments, the operations O202 to O204 (and optionally operations O205 to O206) are applied to a photomask prior to a lithographic process utilizing the photomask (i.e., the operation O207). In some embodiments, the performance of the lithographic process on a semiconductor substrate (e.g., the semiconductor substrate 11a), and application of the operations O202 to O204 prior to the lithographic process can prevent defects on the semiconductor substrate resulting from a contaminated photomask (e.g., the photomask shown in FIG. 2 or FIG. 12). In some embodiments, the operations O202 to O204 (and optionally operations O205 to O206) are applied to the photomask after the lithographic process (i.e., the operation O207) so that contaminants from the lithographic process can be immediately removed. In some embodiments, the method M20 may further include detaching the pellicle 112 and/or exposing the top surface S101' of the photomask substrate 111 prior to the operation O202 depending on the lithographic techniques applied. In some embodiments, the photomask is used in an EUV (extreme ultraviolet) lithography operation (i.e., the pellicle 112 is not attached on the photomask substrate 111 during the process), and the operations O202 to O204 (and optionally operations O205 to O206) are performed on the photomask substrate 111. In some embodiments, the photomask is used in an UV (ultraviolet) lithography operation (i.e., the pellicle 112 remains on the photomask substrate 111 during the process), and the operations O202 to O204 (and optionally operations O205 to O206) are performed on the pellicle 112 and optionally on the photomask substrate 111. In some embodiments, the pellicle 112 is reattached to the photomask substrate 111 after the operation O204 (or after the operation O206).

Figure 14:
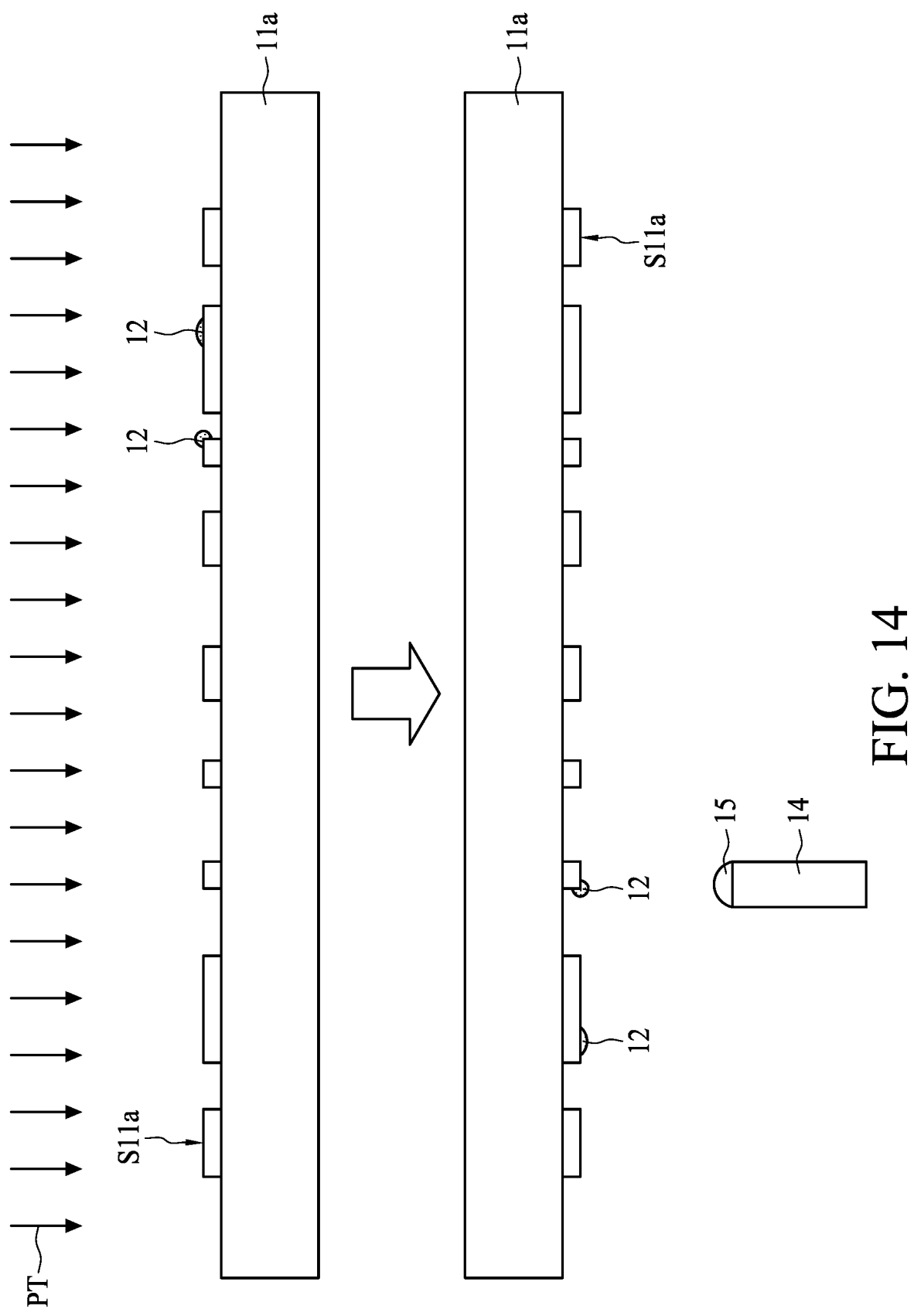
FIG. 14 is a schematic diagram of one or more steps of a semiconductor manufacturing method in accordance with some embodiments of the present disclosure.

In some embodiments, the operations O202 to O205 are performed in a first chamber, and the operation O207 is performed in a second chamber different from the first chamber. In some embodiments, the operation O206 is performed by a control unit (not shown). In some embodiments, the method M20 further includes moving the photomask to another chamber after the operation O204 or when the cleaning result is acceptable to perform the operation O207. In some embodiments, as shown in FIG. 14, a process PT is performed on the semiconductor substrate 11a, thereby forming the patterned surface S11a facing upward. In some embodiments the process PT being a lithographic process, the patterned surface S11a is a surface of a patterned photoresist layer of the semiconductor substrate 11a. In some embodiments the process PT being an etching process, the patterned surface S11a is a surface of a patterned target layer of the semiconductor substrate 11a. In some embodiments, the method M20 further includes turning over the semiconductor substrate 11a, wherein a patterned surface S11a of the semiconductor substrate 11a faces downward toward the cleaning apparatus 14, as shown in FIG. 14.

Figure 15:
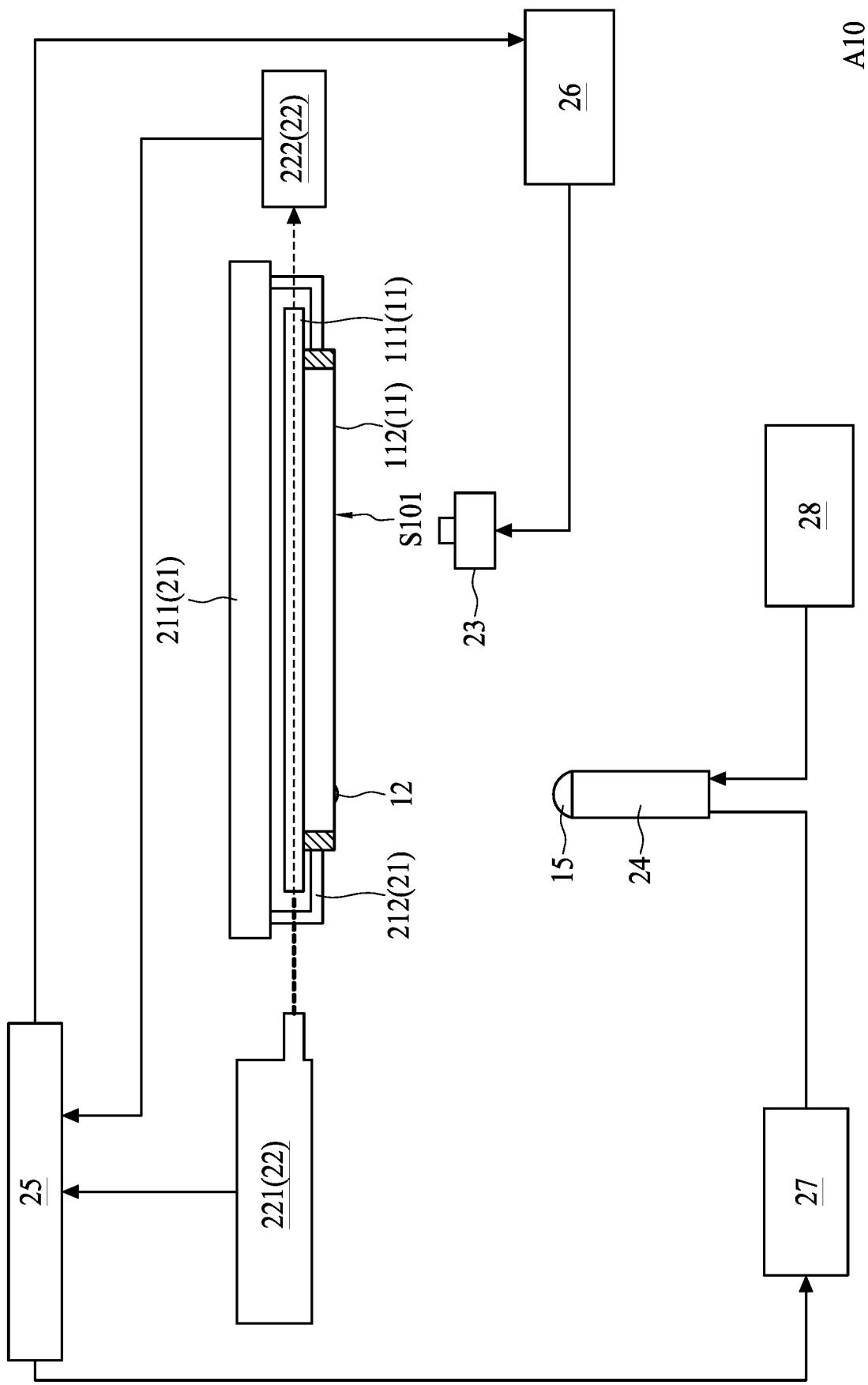
FIG. 15 is a schematic diagram of a system for cleaning a substrate in accordance with some embodiments of the present disclosure.

In another embodiment of the present disclosure, a system A10 for cleaning a substrate is provided. FIG. 15 shows a schematic diagram of the system A10 in accordance with some embodiments. The system A10 includes a substrate holder 21, a substrate sensor 22, a particle recognizer 23 and a cleaning apparatus 24. The substrate holder 21 is configured to hold a substrate 11. The substrate sensor 22 is configured to detect the substrate 11 if the substrate 11 is held on the substrate holder 21. The particle recognizer 23 is configured to identify a location of a particle 12 on a surface S101 of the substrate 11. The cleaning apparatus 24 is configured to perform a cleaning operation on the location of the surface S101 of the substrate 11 by spraying a cleaning liquid 15 flowing against gravity and toward the surface S101 of the substrate 11. FIG. 15 shows that the substrate 11 is a photomask and includes a photomask substrate 111 and a pellicle 112, wherein the surface S101, to which the particle 12 is attached, is an outer surface of the pellicle 112. FIG. 15 is for a purpose of illustration, and is not intended to limit the present disclosure.

Figure 16:
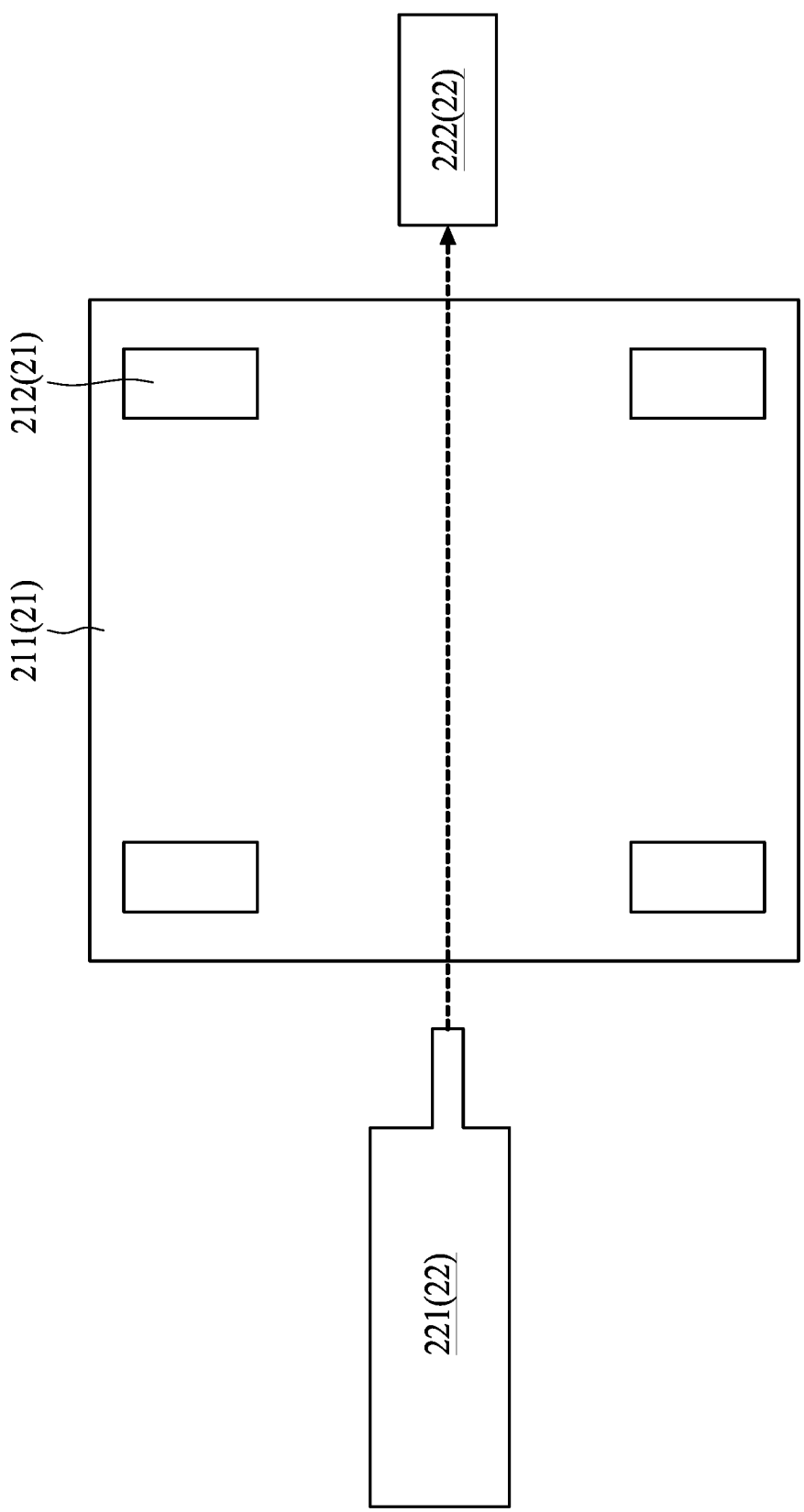
FIG. 16 is a bottom view of a substrate holder of a system without a substrate placed thereon in accordance with some embodiments of the present disclosure.
Figure 17:
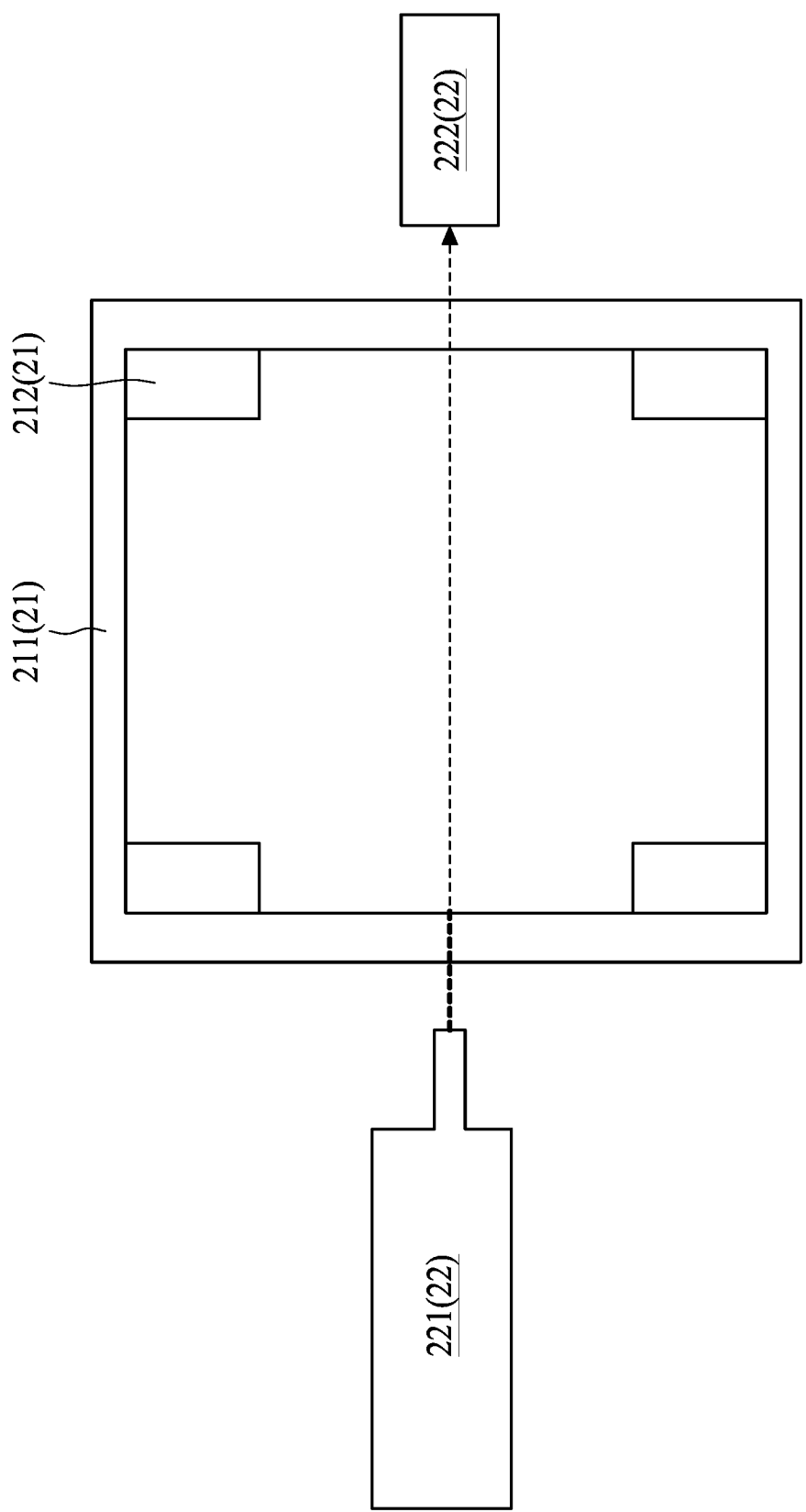
FIG. 17 is a bottom view of a substrate holder of a system with a substrate placed thereon in accordance with some embodiments of the present disclosure.

In some embodiments, the substrate holder 21 includes a stage 211 and at least one holder 212 connected to the stage 211. In some embodiments, the holder 212 is arranged to hold peripherals of the substrate 11, as shown in FIGS. 16 to 17 illustrating bottom views of the substrate holder 21 with and without the substrate 11. In some embodiments, the substrate sensor 22 includes a signal projector 221 and a signal acceptor 222, which are arranged on two opposite sides of the substrate holder 21, or two opposite sides of the substrate 11 when the substrate 11 is held at the position. In some embodiments, the signal projector 221 and the signal acceptor 222 are capable of projecting and receiving signals including optical signals, laser, electron beam, infrared light, or other suitable types of signals. In some embodiments, the signal projector 221 and the signal acceptor 222 are an infrared projector and an infrared acceptor, respectively.

In some embodiments, the projector 221 and the signal acceptor 222 are positioned at two opposite sides of the holder 212 and a same side of the stage 211. The signal projector 221 is configured to project a signal toward signal acceptor 222, and the signal acceptor 222 is configured to receive the signal passing over the stage 211 and between the holders 212. A change in signal intensity is detected if the substrate 11 is held in place on a pathway of the signal between the signal projector 221 and the signal acceptor 222. A signal received when the substrate 11 is held on stage 211 should be weaker than a signal received when the substrate holder 21 is empty due to the interference of the substrate 11 on the signal pathway. As shown in FIG. 16, when the substrate holder 21 is empty, the signal from the signal projector 221 passes through between the holders 212 without interference of the substrate 11, and the signal received is substantially same as the signal projected from the signal projector 221. The signal is shown in FIG. 16 as a dotted line with an arrow showing a direction of the signal, and a thickness of the dotted line indicates that a strength of the signal is merely or barely changed. As shown in FIG. 17, when the substrate 11 is held in place, the signal from the signal projector 221 passes through the substrate 11 and is decayed by the substrate 11. The signal is shown in FIG. 17 as a dotted line with an arrow showing a direction of the signal, and a change in thickness of the dotted line indicates that a strength of the signal is reduced when the signal contacts the substrate 11.

In some embodiments, the particle recognizer 23 is similar to the particle recognizer 13. In some embodiments, the cleaning apparatus 24 is similar to the cleaning apparatus 14. Repeated illustration is omitted herein. In some embodiments, the particle recognizer 23 is configured to again detect the location of the surface S101 of the substrate 11 after the cleaning operation.

In some embodiments, the system A10 further includes a processor 25, communicatively or electrically connected to the substrate sensor 22, the particle recognizer 23, and the cleaning apparatus 24. In some embodiments, the processor 25 includes a CPU (central processing unit). In some embodiments, the processor 25 includes a user interface to show data and conditions of the entire system A10 and/or every device of the system A10. In some embodiments, an image acquired by the particle recognizer 23 is sent to the processer 25 and an image recognition is performed in the processor 25 to identify the location of the particle 12. In some embodiments, the processor 25 is configured to monitor and control sequence and timing of the operations O101 to O105 (or the operations O201 to O205), sub-operations of the operations O101 to O105 (or the operations O201 to O205), and/or other optional operations as illustrated above. In some embodiments, the processor 25 is configured to identify the location of the particle 12 on the surface S101 and to send a signal to control the movement of the cleaning apparatus 24. In some embodiments, the processor 25 is also configured to determine the cleaning result is acceptable and to send a signal to control the movement of the particle recognizer 23 and the cleaning apparatus 24.

In some embodiments, the system A10 further includes a recognizer motor 26, electrically connected to the particle recognizer 23 in order to control the movement and position of the particle recognizer 23 during the process. In some embodiments, the recognizer motor 26 is configured to receive instruction from the processor 25 after the operation O101 or the operation O201. In some embodiments, the system A10 further includes a cleaner motor 27, electrically connected to the cleaning apparatus 24 in order to control the movement and position of the cleaning apparatus 24 during the process. In some embodiments, the cleaner motor 27 is configured to receive instruction from the processor 25 in the operation O103 or the operation O203. In some embodiments, the system A10 further includes a tank 28, connected to the cleaning apparatus 24. In some embodiments, the tank 28 is connected to the cleaning apparatus 24 by a tube. The tank 28 is configured to contain and/or mix the cleaning liquid 15 before the cleaning liquid 15 flows into the cleaning apparatus 24.

Some embodiments of the present disclosure provide a cleaning method applied in semiconductor manufacturing. The method includes: receiving a substrate having a surface; identifying a location of a particle on the surface of the substrate; moving a cleaning apparatus toward the location of the particle; and performing a cleaning operation, thereby removing the particle by spraying a cleaning liquid from the cleaning apparatus flowing against gravity and toward the surface of the substrate.

Some embodiments of the present disclosure provide a semiconductor manufacturing method. The semiconductor manufacturing method includes receiving a photomask having a surface; identifying a location of a particle on the surface of the photomask; moving a cleaning apparatus toward the location of the particle; performing a cleaning operation, thereby removing the particle by spraying a cleaning liquid from the cleaning apparatus flowing against gravity and toward the surface of the photomask; and transferring a pattern of the photomask to a semiconductor substrate.

Some embodiments of the present disclosure provide a system for cleaning a substrate. The system includes a substrate holder, configured to hold the substrate; a substrate sensor, configured to detect the substrate; a particle recognizer, configured to identify a location of a particle on a surface of the substrate; and a cleaning apparatus, configured to perform a cleaning operation on the location of the surface of the substrate by spraying a cleaning liquid flowing against gravity and toward the surface of the substrate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for cleaning a substrate, comprising:
   a substrate holder, configured to hold the substrate;
   a substrate sensor, configured to detect the substrate;
   a particle recognizer, configured to identify a location of a particle on a surface of the substrate;
   a cleaning apparatus, configured to perform a cleaning operation on the location of the surface of the substrate by spraying a cleaning liquid flowing against gravity and toward the surface of the substrate;
   a recognizer motor electrically connected to the particle recognizer and controlling a movement of the particle recognizer; and
   a cleaner motor electrically connected to the cleaning apparatus and controlling a movement of the cleaning apparatus,
   wherein the recognizer motor and the cleaner motor are individually operated.

2. The system of claim 1, wherein the substrate sensor comprises:
   a signal projector, configured to project a signal; and
   a signal acceptor, configured to receive the signal, wherein a change in signal intensity is measured to identify if the substrate is held by the substrate holder.

3. The system of claim 2, wherein the signal projector is disposed at a first side of the substrate holder, and the signal acceptor is disposed at a second side opposite to the first side of the substrate holder.

4. The system of claim 1, wherein the particle recognizer is configured to detect the location of the surface of the substrate after the cleaning operation.

5. The system of claim 1, wherein the particle recognizer includes an optical micro-camera.

6. The system of claim 1, wherein the cleaning apparatus includes at least one radiation source, arranged in a pathway of the cleaning liquid.

7. The system of claim 1, wherein the substrate holder includes a stage, and at least one holder connected to the stage and configured to hold the substrate separated from the stage.

8. An apparatus for cleaning a photomask, comprising:
   a substrate holder, including a stage and a holder connected to the stage, wherein the holder is configured to hold peripherals of a substrate of the photomask;
   a cleaning apparatus, configured to spray a cleaning liquid flowing against gravity and toward a pellicle of the photomask;
   a cleaner motor, electrically connected to the cleaning apparatus to control a movement and a position of the cleaning apparatus; and
   a particle recognizer, configured to identify a location of a particle on a surface of the pellicle of the photomask, wherein the cleaning apparatus and the particle recognizer are individually moved.

9. The apparatus of claim 8, further comprising:
   a processor, electrically connected to the cleaner motor, wherein the cleaner motor is configured to receive instruction of the movement and the position of the cleaning apparatus from the processor.

10. The apparatus of claim 8, further comprising:
    a tank, connected to the cleaning apparatus, and configured to contain the cleaning liquid.

11. The apparatus of claim 8, further comprising:
    a recognizer motor, electrically connected to the particle recognizer and configured to control a movement and a position of the particle recognizer; and
    a processor, electrically connected to the recognizer motor and the particle recognizer, and configured to receive a first signal from the particle recognizer and send a second signal to the recognizer motor.

12. The apparatus of claim 11, wherein the first signal include information of the location of the particle on the surface of the pellicle, and the second signal includes instruction of the movement of the particle recognizer.

13. The apparatus of claim 8, further comprising:
    a signal projector, arranged at a first side of the substrate holder when the photomask is held by the substrate holder; and
    a signal acceptor, disposed at a second side opposite to the first side of the substrate holder when the photomask is held by the substrate holder.

14. The apparatus of claim 13, wherein the signal projector is configured to project a signal toward the signal acceptor, and the signal acceptor is configured to receive the signal.

15. The apparatus of claim 14, wherein the signal includes at least one of optical signals, laser, electron beam, infrared light.

16. The apparatus of claim 13, wherein the signal projector and the signal acceptor are aligned to the substrate of the photomask when the photomask is held by the substrate holder.

17. The apparatus of claim 13, wherein the signal acceptor is electrically connected to a processor, which is configured to determine if the photomask is held in place based on an intensity of the signal received by the signal acceptor.

18. A system for cleaning a substrate, comprising:
    a particle recognizer, configured to identify configurations of a first particle and a second particle on a surface of the substrate;
    a first cleaning apparatus, configured to perform a first cleaning operation targeting the first particle, wherein the substrate is disposed above the first cleaning apparatus during the first cleaning operation;
    a second cleaning apparatus, configured to perform a second cleaning operation targeting the second particle, wherein the substrate is disposed above the second cleaning apparatus during the second cleaning operation; and
    a processor, electrically connected to the particle recognizer, the first cleaning apparatus and the second cleaning apparatus, and configured to control the first cleaning operation and the second cleaning operation,
    wherein the particle recognizer and the first cleaning apparatus are individually moved.

19. The system of claim 18, wherein the first particle and the second particle include different configurations, and the first cleaning operation and the second cleaning operation include different cleaning liquids.

20. The system of claim 18, wherein the first cleaning apparatus is vertical to the surface of the substrate during the first cleaning operation, and the second cleaning apparatus is tilted to the surface of the substrate during the second cleaning operation.

\* \* \* \* \*